(12) United States Patent
Cetin et al.

(10) Patent No.: US 7,642,943 B1
(45) Date of Patent: Jan. 5, 2010

(54) ANALOG-TO-DIGITAL CONVERTER CIRCUIT AND METHOD WITH PROGRAMMABLE RESOLUTION

(75) Inventors: Joseph Cetin, San Diego, CA (US);
Jason Muriby, San Diego, CA (US);
Matthew Sienko, La Jolla, CA (US);
Ibrahim Yayla, Delmar, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 41 days.

(21) Appl. No.: 11/963,314

(22) Filed: Dec. 21, 2007

Related U.S. Application Data (60) Provisional application No. 60/876,807, filed on Dec. 22, 2006.

(51) Int. Cl.
*H03M 1/12* (2006.01)
(52) U.S. Cl. ........................ 341/156; 323/272
(58) Field of Classification Search ......... 341/118–159; 323/272–285
See application file for complete search history.

(56) References Cited

U.S. PATENT DOCUMENTS

| | | | | |
|---|---|---|---|---|
| 6,518,898 B1* | 2/2003 | Choksi | .................. | 341/118 |
| 6,606,048 B1* | 8/2003 | Sutardja | .................. | 341/155 |
| 6,762,708 B1* | 7/2004 | Sutardja | .................. | 341/155 |
| 6,979,982 B2* | 12/2005 | Herbert | .................. | 323/272 |
| 7,023,190 B2* | 4/2006 | Chapuis | .................. | 323/282 |
| 7,042,271 B2* | 5/2006 | Chung et al. | ............... | 327/341 |
| 7,426,123 B2* | 9/2008 | Leung et al. | .................. | 341/53 |

* cited by examiner

*Primary Examiner*—Lam T Mai (57) ABSTRACT

Disclosed are a circuit and a method for an analog-to-digital conversion with programmable resolution. The circuit includes a resistor ladder comprising a plurality of resistors coupled to a plurality of comparators; wherein the resistor ladder is further coupled to a switch logic circuit and a plurality of current sources; and wherein the switch logic circuit is configured to control an operation of a plurality of switches to alter conversion resolution of the ADC, and an error correction circuit coupled to the outputs of the plurality of comparators, wherein the ADC is configured to perform a first conversion step and a second conversion step, and wherein the ADC is configured to perform only the first conversion step when programmed for lower conversion accuracy and higher conversion speed.

18 Claims, 6 Drawing Sheets

ANALOG-TO-DIGITAL CONVERTER CIRCUIT AND METHOD WITH PROGRAMMABLE RESOLUTION

This application claims priority under 35 U.S.C. § 119(e) to U.S. Provisional Application No. 60/876,807, filed on Dec. 22, 2006, the entire contents of which are hereby incorporated by reference herein.

BACKGROUND

1. Field of the Invention

The present invention relates to electronic analog-to-digital converter circuits. More particularly, the present invention relates to an analog-to-digital converter circuit and method having a programmable resolution.

2. Background Information

A conventional Flash analog-to-digital converter (ADC) is a circuit which converts an analog input signal to a digital output signal at high speed. Flash ADCs are well suited to applications requiring large bandwidth. The number of bits at the output of these circuits varies, with those circuits having the greater number of output bits having the greater resolution and a greater potential accuracy. A disadvantage of flash ADCs is that the circuitry for high resolution output flash converters grows exponentially as the number of bits of resolution increases. A further disadvantage of flash ADCs is that they consume large amounts of power and area, and, thus, can be quite expensive. Hence, flash ADCs are generally reserved for high frequency applications that cannot be addressed using other slower ADCs. Flash ADC applications include, for example, satellite communication, radar processing, sampling oscilloscopes, high-density disk drives, and the like.

Figure 1:
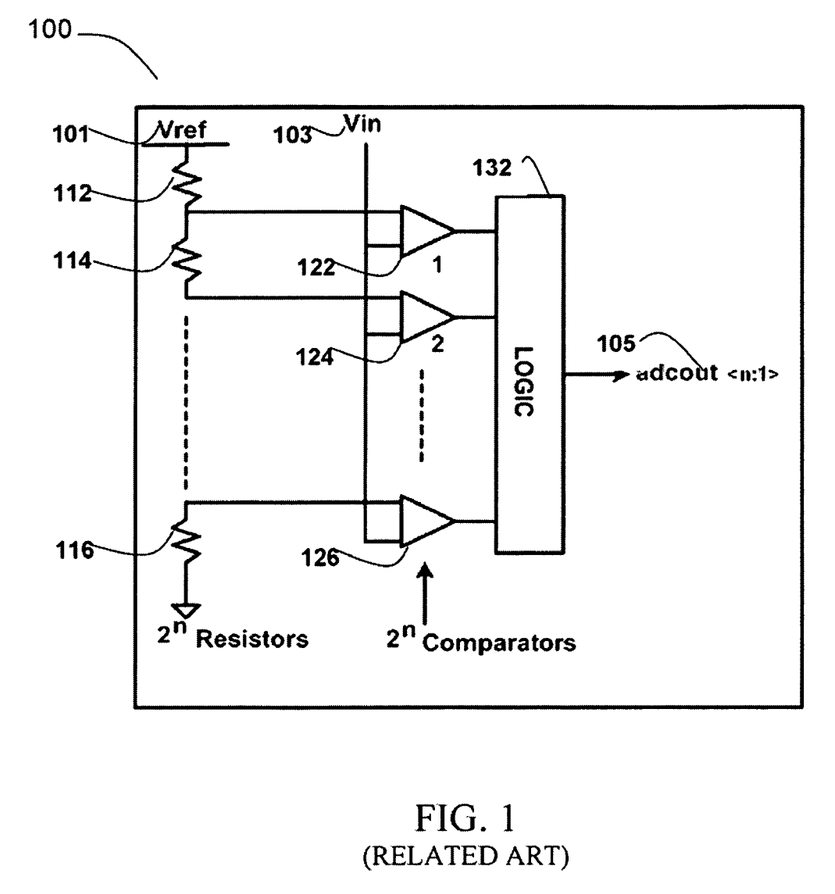
FIG. 1 illustrates a circuit diagram of a conventional flash analog-to-digital converter.

A conventional flash ADC circuit 100 is illustrated in FIG. 1. The ADC circuit 100 achieves an n-bit conversion by using a resistor network of $2^n$ resistors and $2^n$ comparators. The conventional flash ADC circuit 100 comprises a resistive network of $2^n$ resistors including a first resistor 112, a second resistor 114, and up to a $2^n$th resistor 116. The voltage node between each resistor in the resistive network provides a reference voltage up to the topmost node (Vref) 101. An input signal (Vin) 103 is provided to a comparator network of $2^n$ comparators including a first comparator 122, a second comparator 124, and up to a $2^n$th comparator 126. The comparators compare a given voltage from the resistive network to the input signal (Vin) 103. The output of the comparators is provided to a logic circuit 132, where the output is decoded to the appropriate digital output signal (adcout) 105.

Figure 2:
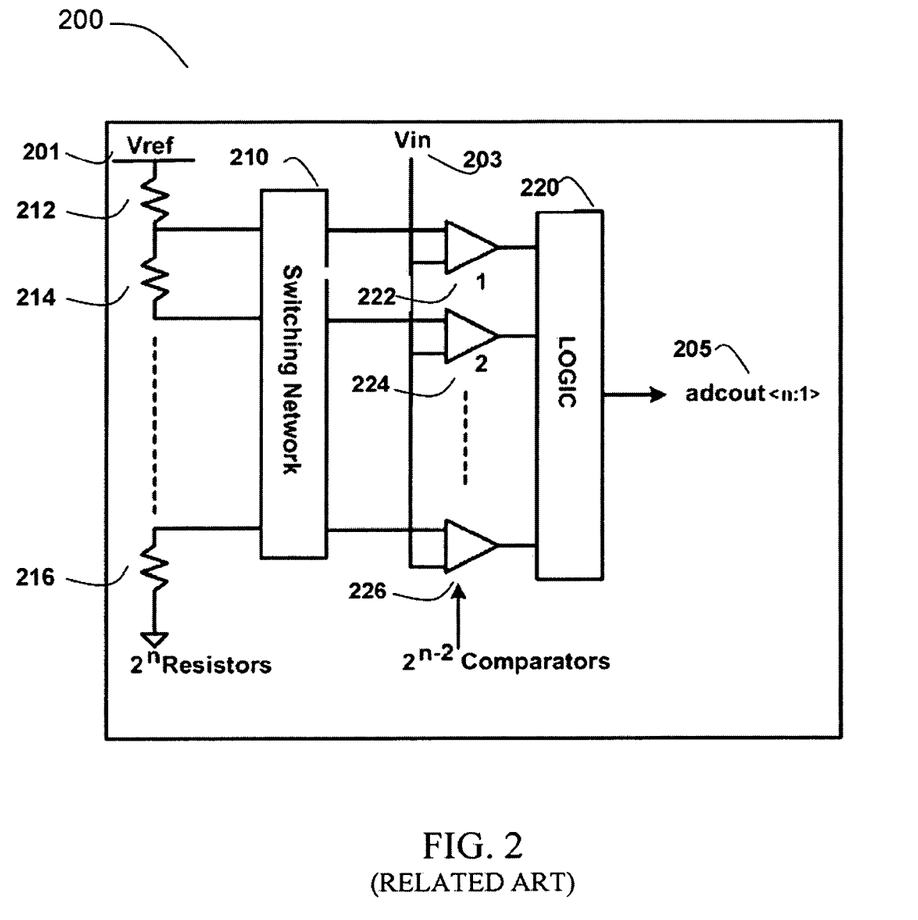
FIG. 2 illustrates a circuit diagram of a conventional two-step flash analog-to-digital converter.

Another conventional flash ADC, also called as a two-step flash ADC, is illustrated in FIG. 2. The two-step conventional flash ADC 200 achieves an n-bit conversion by employing a resistor network of $2^n$ resistors and a comparator network of $2^{n-2}$ comparators. The two-step conventional flash ADC 200 comprises a resistive network of $2^n$ resistors including a first resistor 212, a second resistor 214, and up to a $2^n$th resistor 216. Similar to the conventional flash ADC 100, the resistor network in the two-step flash ADC 200 provides several reference voltages up to the topmost resistor node voltage (Vref) 201. An input signal (Vin) 203 is provided to a comparator network of $2^{n-2}$ comparators including a first comparator 222, a second comparator 224, and up to a $2^{n-2}$th comparator 226. The output of the resistor network is provided to a switching network 210. The conventional two-step Flash ADC 200 performs two conversions, a coarse conversion and a fine-tuned conversion, of the input signal 203. The switching network 210 is reconfigured by the output of the coarse conversion. The circuitry for the switching network 210 varies by implementation choice. For example, such circuitry can comprise a Digital-to-Analog converter (DAC), a subtraction circuit, another lesser-resolution Flash ADC, or the like. The circuitry in the switching network 210 is generally set on clock phases to determine whether a coarse or fine conversion is being performed. The output of the switching network 210 is further provided to the comparators. The output of the comparators is provided to a logic circuit 220, where the output is decoded to generate an appropriate digital output signal (adcout) 205.

A disadvantage of the conventional flash ADC 100 is that as the conversion resolution increases, there is an exponential growth of the die area and an increase in die cost as the number of bits of resolution 'n' increases, due to the array of $2^n$ resistors and $2^n$ comparators required.

A disadvantage of the conventional flash ADC 200 is that although the numbers of comparators has been reduced, a complicated switching network and additional circuitry are still required, which consumes area and power.

A disadvantage of conventional two step ADCs is that they are not programmable to only use the coarse step when less accuracy and higher conversion speed are required. Conventional two-step analog to digital conversion methods require a resistor element of very high accuracy, which increases the design complexity of the Analog to Digital converter.

It would be desirable to provide an improved ADC having a higher resolution, programmability, and a faster conversion speed with a minimal increase in die area and power consumption.

SUMMARY OF THE INVENTION

A circuit and method are disclosed for a programmable analog-to-digital circuit (ADC), which achieves higher resolution without exponential increase in area and power consumption. In accordance with exemplary embodiments of the present invention, according to a first aspect of the present invention, the programmable ADC circuit includes a resistor ladder comprising a plurality of resistors coupled to inputs of a plurality of comparators, wherein the resistor ladder is further coupled to a switch logic circuit and a plurality of current sources and wherein a switch logic is configured to control an operation of a plurality of switches to alter conversion resolution of the ADC. An error correction circuit is coupled to outputs of the plurality of comparators, wherein the ADC is configured to perform a first conversion step and a second conversion step, and wherein the ADC is configured to perform only the first conversion step when programmed for lower conversion accuracy and higher conversion speed.

According to the first aspect, the ADC comprises a conversion resolution of n bits, using a $2^{n-2}$ resistors and a $2^{n-2}$ comparators. The resistor ladder comprises a first connection and a second connection, the first connection further comprises a first current source providing a first reference current coupled to the resistor ladder. The second connection of the resistor ladder is coupled to the switch logic, which comprises a first switch, a second switch, a resistor, and wherein the switch logic is coupled to a second current source. The error correction circuit is configured to generate a digital output signal with an n-bit resolution, and wherein the error correction circuit is configured to correct for alignment errors between two consecutive conversions. The first conversion step comprises a coarse measurement of an input signal to the ADC, and wherein the second conversion step comprises a fine measurement of the input signal. The plurality of resistors in the resistor ladder comprises a quantity of resistors needed for performing the coarse measurement.

According to a second aspect of the present invention, an analog-to-digital converter device is disclosed, which includes a resistor divider network. The device includes a plurality of switches coupled to a first end of the resistor divider network. The device includes a first current source coupled to a second end of the resistor divider network. A resistor is coupled to one of the plurality of switches. The device includes a second current source, which is coupled to the resistor, wherein the device is configured to perform a first conversion step and a second conversion step, and wherein the device is configured to perform only the first conversion step when programmed for lower conversion accuracy and higher conversion speed.

According to the second aspect, the device is configured to provide a resolution of n-bits with $2^{n-2}$ resistors and $2^{n-2}$ comparators. The plurality of switches comprises a first switch and a second switch coupled to a grounded terminal and the second current source respectively. Each of the first switch and the second switch comprises a PMOS (P channel Metal Oxide Semiconductor) transistor in a first example of the invention. Each of the first switch and the second switch comprises a NMOS (N channel Metal Oxide Semiconductor) transistor in a second example of the invention.

According to a third aspect of the present invention, a method for converting an analog input signal to a digital output signal using an analog-to-digital converter (ADC) circuit comprising $2^{n-2}$ resistors and $2^{n-2}$ comparators and having a resolution of n-bits is disclosed. The method comprises a first step of performing a coarse conversion measurement of the analog input signal to generate a coarsely-converted signal, wherein the digital output signal is generated in accordance with the coarsely-converted signal when the ADC is programmed for low conversion accuracy and high conversion speed; and performing a fine conversion measurement of the coarsely-converted signal to generate a finely-converted signal, wherein the digital output signal is generated in accordance with the finely-converted signal when the ADC is programmed for high conversion accuracy and low conversion speed.

According to a fourth aspect of the present invention, a method for converting an analog signal to a digital signal is disclosed, which comprises a first step of providing a first reference input signal to a resistor ladder via a first current source, wherein the resistor ladder comprises a plurality of resistors; and a second step of acquiring a plurality of reference voltages, wherein the reference voltage is the voltage obtained between every resistor in the resistor ladder, and wherein a number of the plurality of reference voltages corresponds to a number of the plurality of resistors.

According to the fourth aspect, the method comprises steps of: comparing the plurality of reference voltages with an input voltage (Vin), wherein the input voltage (Vin) is an analog voltage to be converted to a digital equivalent; determining which of the reference voltages among plurality of reference voltages is closer to the input voltage (Vin); and achieving a first (n−2) bit conversion by converting the decided closest reference voltage to a digital output signal.

According to an exemplary embodiment of the fourth aspect of the present invention, the method comprises a step of determining the position of the input voltage (Vin) into a plurality of quadrants or voltage ranges, wherein the plurality of reference voltages are divided into a plurality of quadrants or voltage ranges. The method comprises scaling the plurality of reference voltages into a predetermined voltage range, wherein the predetermined voltage range is the voltage range where the input voltage (Vin) is positioned; and the method comprises performing a second (n−2) bit conversion, wherein the (n−2) bits from the first (n−2) bit conversion and the last 2-bits of the second (n−2) bit conversion is used for the n-bit conversion. In accordance with an example of the invention, the method comprises generating a digital output signal with minimal alignment errors between two subsequent n-bit conversions; and configuring a switch logic circuit to coordinate a coarse conversion and a fine conversion of an analog signal to a digital signal. The method comprises achieving an n-bit conversion resolution using $2^{n-2}$ resistors and $2^{n-2}$ comparators; and providing a programmable resolution and a fast conversion speed.

According to an exemplary embodiment of the present invention, a method for converting an analog signal to a digital signal with a programmable resolution comprises: for a first select input a first switch is closed, a second switch is open, a first current source is set to a first value to scale down a range of a resistor ladder; for a second select input the first switch is open, the second switch is closed, bottom of the resistor ladder is raised from ground potential to a first potential; for a third select input the first switch is open, the second switch is closed, a second current source is set to the first value, raising the first potential to a second potential; and for a fourth select input the second current source is set to a second value, raising the second potential to a third potential.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to a circuit and method for an analog-to-digital converter for converting an analog input signal to a digital output signal with a programmable resolution and fast conversion speed. In an exemplary embodiment of the present invention, the improved circuit is configured to achieve an n-bit conversion, utilizing $2^{n-2}$ resistors and $2^{n-2}$ comparators. The improved circuit comprises a resistor ladder comprising a plurality of resistors coupled to inputs of a plurality of comparators, wherein the resistor ladder is further coupled to a switch logic circuit and a plurality of current sources and wherein a switch logic is configured to control an operation of a plurality of switches to alter conversion resolution of the ADC. An error correction circuit is coupled to outputs of the plurality of comparators, wherein the ADC is configured to perform a first conversion step and a second conversion step, and wherein the ADC is configured to perform only the first conversion step when programmed for lower conversion accuracy and higher conversion speed.

According to an exemplary embodiment of the invention, an analog-to-digital converter device (ADC) comprises a resistor divider network; a plurality of switches coupled to a first end of the resistor divider network; a first current source coupled to a second end of the resistor divider network; a resistor coupled to one of the plurality of switches; and a second current source coupled to the resistor, wherein the device is configured to perform a first conversion step and a second conversion step and wherein the device is configured to perform only the first conversion step when programmed for lower conversion accuracy and higher conversion speed. The device is configured to provide a resolution of n-bits with $2^{n-2}$ resistors and $2^{n-2}$ comparators. The plurality of switches comprises a first switch and a second switch coupled to a grounded terminal and the second current source respectively.

In an exemplary embodiment of the present invention, a method for converting an analog signal to a digital signal using an ADC circuit comprising $2^{n-2}$ resistors and $2^{n-2}$ comparators and having a maximum resolution of n-bits, the method comprising comprises steps of performing a coarse conversion measurement of the analog input signal to generate a coarsely-converted signal, wherein the digital output signal is generated in accordance with the coarsely-converted signal when the ADC is programmed for low conversion accuracy and high conversion speed; and performing a fine conversion measurement of the coarsely-converted signal to generate a finely-converted signal, wherein the digital output signal is generated in accordance with the finely-converted signal when the ADC is programmed for high conversion accuracy and low conversion speed.

Figure 3:
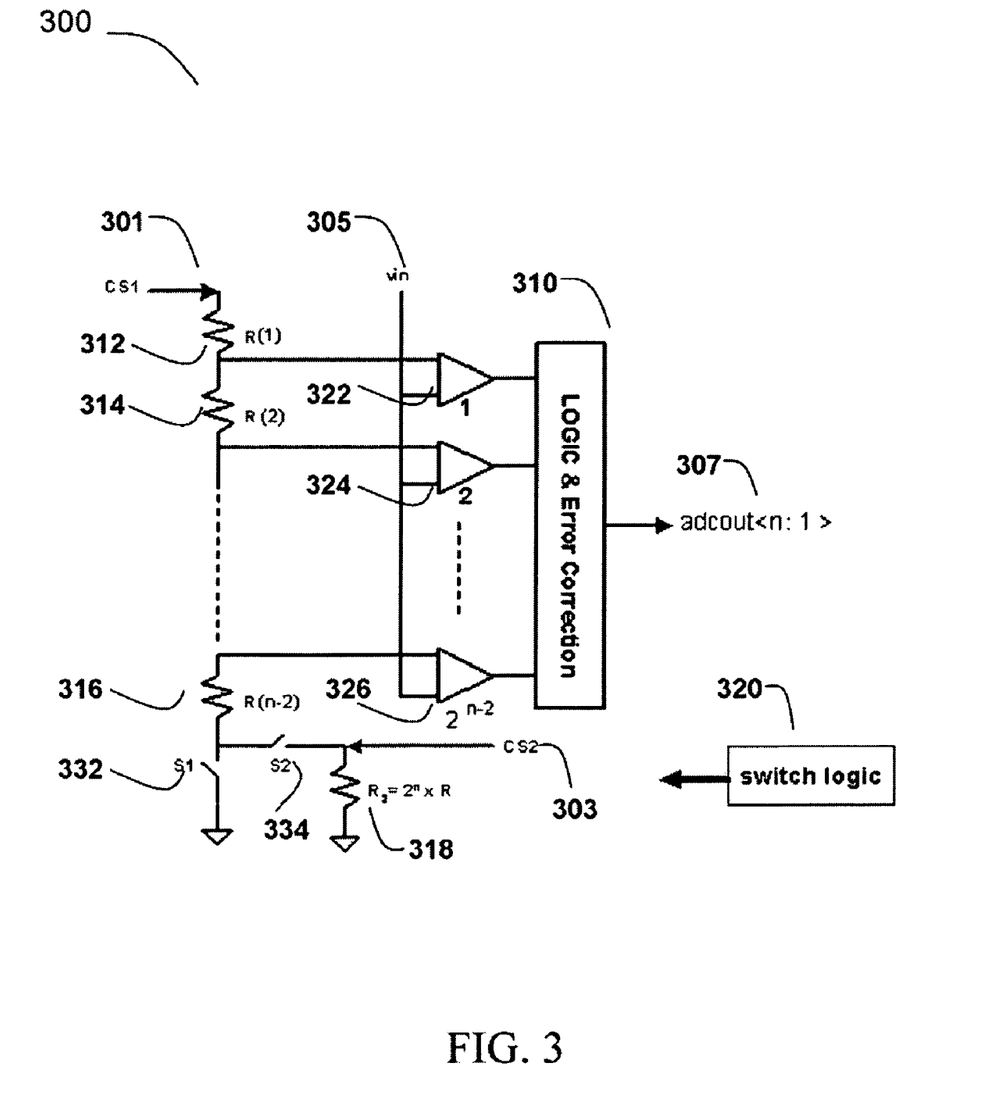
FIG. 3 illustrates a circuit diagram of an improved programmable resolution flash analog-to-digital converter, in accordance with an exemplary embodiment of the present invention.

These and other aspects and embodiments of the present invention will now be described in greater detail. FIG. 3 illustrates an exemplary embodiment of an analog-to-digital converter (ADC) circuit 300 comprising a resistor ladder that includes a first resistor 312, a second resistor 314, and so on up to a number $2^{n-2}$, resistor 316. The circuit 300 also includes a set of comparators comprising a first comparator 322, a second comparator 324, and up to a number $2^{n-2}$ comparator 326. In an exemplary embodiment, the circuit 300 further comprises a first current source (CS1), a second current source (CS2), a logic and an error correction circuit 310, a plurality of switches including a first switch (S1) 332, a second switch (S2) 334, a resistor ($R_2$) 318, and a switch logic circuit 320. The first switch (S1) 332 and the second switch (S2) 334 are connected in a parallel configuration in an exemplary embodiment of the present invention.

The circuit 300 is configured to achieve an n–2-bit conversion using $2^{n-2}$ resistors 312 to 316 and $2^{n-2}$ comparators 322 to 326, wherein two n–2 bit conversions are combined to obtain the n-bit conversion. During a first n–2 bit conversion, the resistor ladder of the circuit 300 receives a first reference current ($I_{ref}$) 301 via the first current source (CS1) wherein the voltage at a first end (top end in an example) of the resistor ladder is the $V_{fullscale}=(I_{ref}*n*R)$, wherein n–2 is the number of resistors ('n' can be any suitable integer), and R is the resistance (in ohms for example) of each resistor. In accordance with exemplary embodiments, the voltage between consecutive resistors among the plurality of resistors of the resistor ladder is determined. Therefore, for $2^{n-2}$ resistors there are $2^{n-2}$ reference voltages in accordance with an example of the invention. An input voltage (Vin) 305 is provided to an input terminal of each of the comparators in the comparator set which comprises $2^{n-2}$ comparators. Using the other input terminal of each comparator, the input voltage (Vin) 305 is compared with each of the $2^{n-2}$ reference voltages. Based on the output signal from the comparator (depending upon a predetermined threshold voltage as a reference) the closest match between the input voltage (Vin) and the reference voltage is determined. The output signal from the comparator having the closest match is converted to and stored as an n–2 bit value which represents the closest digital value to the analog input voltage (Vin) 305 in accordance with an example of the present invention.

In order to perform the second n–2 bit conversion, the circuit 300 first determines in which of four quadrants or voltage ranges the input voltage (Vin) 305 is located. The $2^{n-2}$ reference voltages can be logically divided into four quadrants or voltage ranges. For example, a first quadrant can comprise the voltage range between about 0 Vfullscale to about ¼ Vfullscale, the second quadrant can comprise the voltage range between about ¼ Vfullscale to about ½ Vfullscale, the third quadrant can comprise the voltage range between about ½ Vfullscale to about ¾ Vfullscale, and the fourth quadrant can comprise the voltage range between about ¾ Vfullscale to about Vfullscale. According to an exemplary embodiment, the circuit 300 can use, for example, the first 2-bits of the first n–2 bit conversion to determine the position of the input voltage signal (Vin) 305 within the four quadrants or voltage ranges, although any suitable number of bits of the first n–2 bit conversion can be used. Once the quadrant of the input voltage signal (Vin) 305 is determined, all the $2^{n-2}$ reference voltages are scaled to fall within the determined quadrant. The $2^{n-2}$ reference voltages are scaled by adjusting the first reference current (Iref) 301 and a second reference current (Iref) 303 from the second current source (CS2), wherein the first switch (S1) 332, the second switch (S2) 334 and the resistor $R_2$ 318 are utilized to control the second reference current (Iref) 303.

An exemplary and non limiting embodiment of the present invention shows a manner in which the switches in the switch logic circuit can be controlled. If MSBs are 00 (suggesting that input lies in the lowest quadrant of the input voltage range), then S1 is kept closed, S2 is left open, and CS 1 is set to Iref/4 to reduce the reference ladder to one fourth of its range. This allows for a finer conversion in the lowest quadrant of the input range. If MSBs are 01, then S1 is opened and S2 is closed. This raises the bottom of the reference ladder from ground to ¼th of the full scale, thereby allowing a conversion in the second quadrant of the input range. Similarly, if MSBs are 10, while S1 is left open and S2 is kept closed, CS2 is set to Iref/4. This raises the bottom voltage of the ladder to half of the full scale, thereby allowing a conversion in the third quadrant of the input range. Finally, if MSBs are 11, CS2 is set to Iref/2 which raises the bottom voltage of the ladder to 75% of the full scale, thereby allowing a conversion in the fourth (top most) quadrant of the input range in accordance with an example of the present invention.

For example, if the input voltage signal (Vin) 305 is positioned in the first quadrant or voltage range (e.g., about 0 Vfullscale to about ¼ Vfullscale), then the $2^{n-2}$ reference voltages can be divided within the first quadrant (e.g., about 0 Vfullscale to about ¼ Vfullscale. If the input voltage signal (Vin) 305 is positioned in the second quadrant or voltage range (e.g., about ¼ Vfullscale to about ½ Vfullscale), then the $2^{n-2}$ reference voltages can be divided within the second quadrant (e.g., about ¼ Vfullscale to about ½ Vfullscale). If the input voltage signal (Vin) 305 is positioned in the third quadrant or voltage range (e.g., about ½ Vfullscale to about ¾ Vfullscale), then the $2^{n-2}$ reference voltages can be divided within the third quadrant (e.g., about ½ Vfullscale to about ¾ Vfullscale). If the input voltage signal (Vin) 305 is positioned in the fourth quadrant or voltage range (e.g., about ¾ Vfullscale to about Vfullscale), then the $2^{n-2}$ reference voltages can be divided within the fourth quadrant (e.g., about ¾ Vfullscale to Vfullscale). A second n−2 bit conversion is then executed with all of the $2^{n-2}$ reference voltages scaled into the specific quadrant within which the input voltage signal (Vin) 305 is located. The first n−2 bit conversion and the second n−2 bit conversion are utilized to obtain an n-bit conversion. The (n−2) bits from the first n−2 bit conversion forms the first (n−2) bits of the n bit conversion and the last 2-bits from the second n−2 bit conversion forms the last 2-bits of the n bit conversion, thereby achieving the n-bit conversion.

According to exemplary embodiments, the logic block of the logic and error correction circuit 310 of ADC circuit 300 is configured to combine the two n−2 bit outputs to form an n-bit output at (adcout) 307. Since the second n−2 bit conversion is a scaled-in conversion of the first n−2 bit conversion, there is overlap between two conversions. The overlapping parts of each n−2 bit conversion should match. In the circuit 300, the error correction circuit of the logic and error correction circuit 310 is configured to analyze the two n−2 bit conversions that make up the n-bit output and verifies that the overlapping parts of the two conversions match. If the overlapping parts of the first n−2 bit conversion and second n−2 bit conversion do not match, the error correction circuit of the logic and error correction circuit 310 suitably adjusts the value of the n-bit output (adcout) 307 in such a way as to minimize the error between the digital output representation code (adcout) 307 and the input voltage signal (Vin) 305.

An advantage of the circuit 300 is that an n-bit conversion is obtained with $2^{n-2}$ resistors and $2^{n-2}$ comparators, thereby using less die area and less power than previously discussed conventional implementations. Another advantage of the circuit 300 is that the circuit 300 is programmable to perform either the n−2 bit conversion or the n-bit conversion, whereby the user can decide whether to use the circuit 300 for its highest conversion resolution or to obtain higher conversion speed with only n−2 bit resolution in a non-limiting example of the present invention. in particular, the circuit 300 is configured to perform a two-step conversion process, as previously discussed. In particular, the circuit 300 is configured to perform a first, coarse measurement step, and a second, fine-tuned measurement step. According to exemplary embodiments, the Circuit 300 can be suitably programmed to perform only the coarse measurement step if the user desires less conversion accuracy, but higher conversion speed. Alternatively, the circuit 300 can be suitably programmed by using a computer software code, a high definition language (I{DL) or the like to perform both the coarse and fine measurement steps if the user desires higher conversion accuracy, but slow conversion speed. According to an example of the invention, the computer software program or the HDL or the like programs the switch logic circuit thus coordinating the operability of the first switch and the second switch. Accordingly, the circuit 300 can enable fast, conversion of an analog input signal to a digital output signal, and is, therefore, well suited for use in digital signal processing applications such as, for example, communication systems, medical systems and the like. Alternatively, the circuit 300 can be used in and with applications that require higher conversion accuracy.

In accordance with an exemplary embodiment of the invention, a method is disclosed comprising steps of: for a first select input a first switch (e.g., the first switch (S1) 332 of FIG. 3) is closed, a second switch (e.g., the second switch (S2) 334 of FIG. 3) is open, a first current source (e.g., the current source (CS1) 301 of FIG. 3) is set to a first value to scale down a range of a resistor ladder; for a second select input the first switch is open, the second switch is closed, bottom of the resistor ladder is raised from ground potential to a first potential; for a third select input the first switch is open, the second switch is closed, a second current source (e.g., the current source (CS2) 303 of FIG. 3) is set to the first value, raising the first potential to a second potential; and for a fourth select input the second current source is set to a second value, raising the second potential to a third potential.

Figure 4:
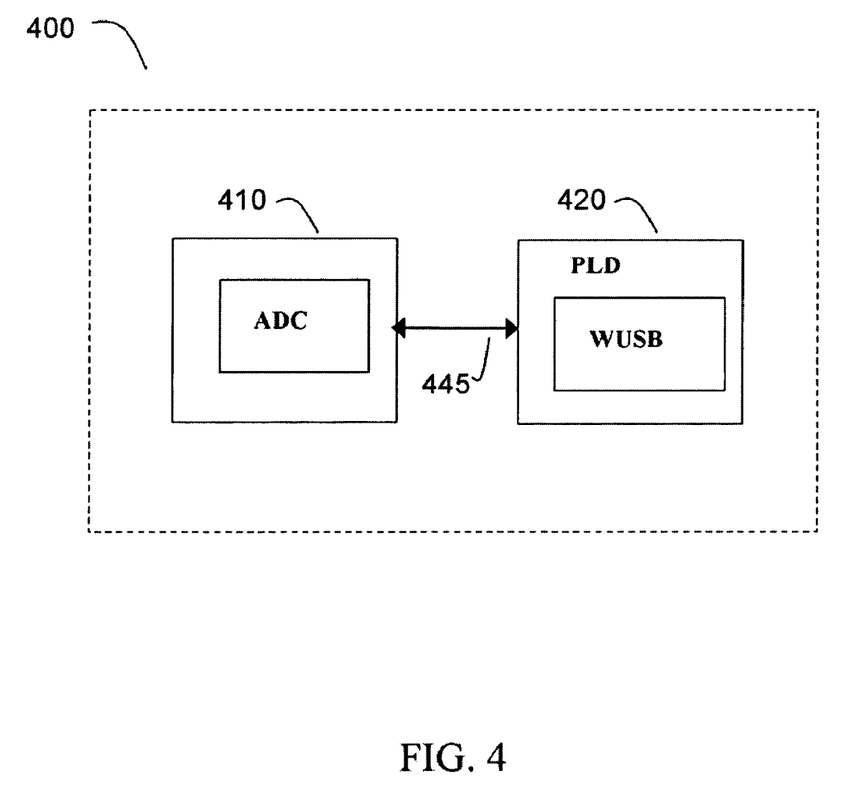
FIG. 4 illustrates a device with an improved programmable resolution flash analog-to-digital converter, in accordance with an exemplary embodiment of the present invention.

FIG. 4 illustrates a device 400 in an exemplary embodiment of the present invention. The device 400 further comprises a flash ADC 410 in accordance with an example of the present invention. However, the device 400 of the present invention is not confined or restricted only to the flash ADC circuit. The circuit 410 is further coupled to components of a circuit 420 via connectors 445. The connectors 445 include suitable wired or wireless means of connecting the components of the circuit 420 to the circuit 410. In an exemplary embodiment of the present invention, the ADC circuit 410 is configured to achieve an n-bit conversion, utilizing $2^{n-2}$ resistors and $2^{n-2}$ comparators. The improved ADC circuit 410 comprises a resistor ladder comprising a plurality of resistors coupled to inputs of a plurality of comparators, wherein the resistor ladder is further coupled to a switch logic circuit and a plurality of current sources and wherein a switch logic is configured to control an operation of a plurality of switches to alter conversion resolution of the ADC 410. An error correction circuit is coupled to outputs of the plurality of comparators, wherein the ADC 410 is configured to perform a first conversion step and a second conversion step, and wherein the ADC is configured to perform only the first conversion step when programmed for lower conversion accuracy and higher conversion speed. The circuit 410 is configured to convert analog input signal to a digital input signal with a programmable, high resolution, and a fast conversion speed. The output signal from the circuit 410 can then be provided to functional components of the circuit 420. In an exemplary embodiment of the present invention, the circuit 420 is a programmable logic device (PLD) comprising a Wireless USB (WUSB) or like. According to an example of the present invention, the device 400 as a single data converter can operate in two distinct mode of operations (7 bit mode and 5 bit mode for example).

An exemplary and a non-limiting embodiment of the present invention uses two conversion steps and fewer elements to achieve higher accuracy conversion of analog voltages to digital output. The first conversion step is a course measurement of the input voltage (Vin) and the second conversion step is a fine-tuned measurement of the input voltage (Vin). In order to use fewer resistors during the higher accuracy conversion step, this invention switches the reference level across the entire resistor ladder (n−2 resistors for example) to give the result of increased resolution. As an example of the invention one can think of this as zooming in to a specific area and slicing it up the zoomed in area the same number of times as the original picture.

Figure 5:
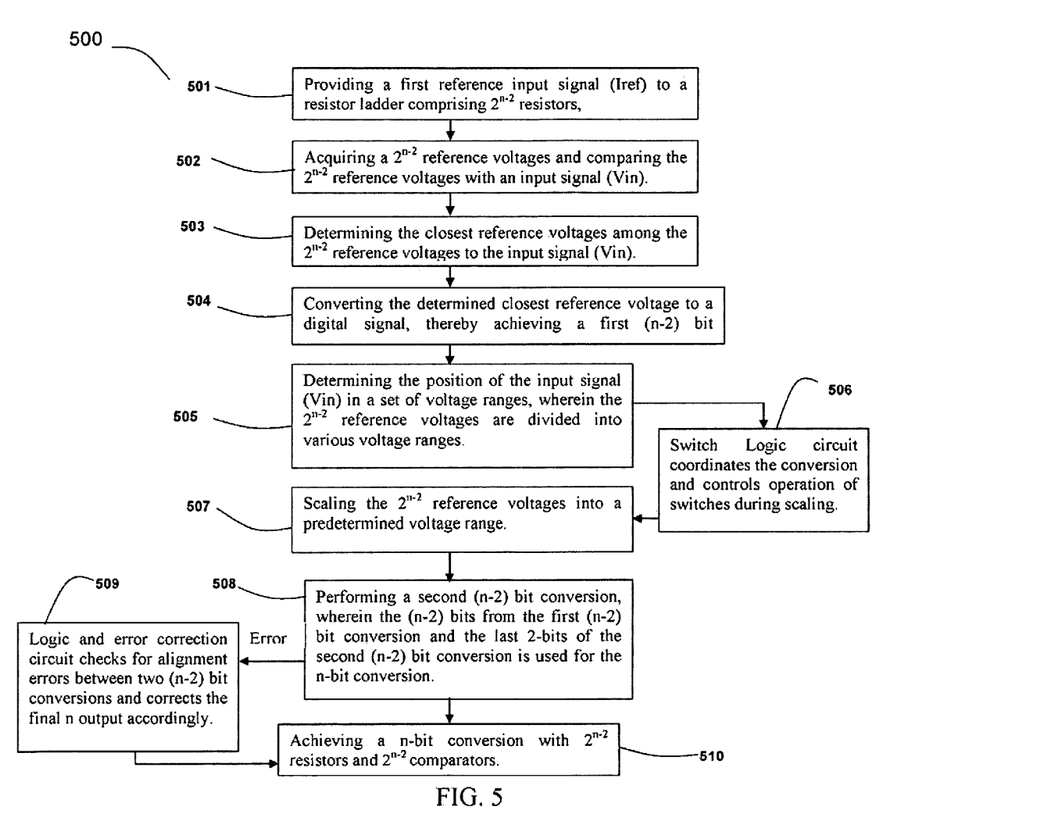
FIG. 5 illustrates a flow chart for converting an analog signal to a digital signal, in accordance with an exemplary embodiment of the present invention.

FIG. 5 illustrates a flow chart 500 depicting a method for converting an analog input signal to a digital output signal with programmable resolution and a fast conversion speed. A first step 501 comprises providing a first reference input signal ($I_{ref}$) 301 to a resistor ladder via a first current source (CS1), wherein the resistor ladder further comprises a plurality of resistors. The voltage at the top of the resistor ladder is Vfullscale=$(I_{ref}*n*R)$, wherein n is any suitable number of resistors and R is the resistance (in ohms) of the resistors. A second step 502 comprises acquiring a plurality of reference voltages ($2^{n-2}$ reference voltages in a non-limiting example of the invention), wherein the reference voltage is the voltage obtained between every resistor in the resistor ladder, and wherein a number of plurality of reference voltages corresponds to a number of plurality of resistors. A third step 503 comprises deciding which reference voltage among the plurality of reference voltages is closer to the input voltage signal (Vin) 305. A fourth step 504 comprises performing an n−2 bit conversion by converting the decided closest reference voltage to a digital output signal (adcout) 307. A fifth step 505 comprises determining the position of the input voltage signal (Vin) 305 within a set of voltage ranges, wherein the plurality of reference voltages are divided to form a set of voltage ranges.

A sixth step 506 comprises configuring a switch logic circuit 320 to coordinate the conversion and controlling the operation of both the first switch (S1) 332 and the second switch (S2) 334. A seventh step 507 comprises modifying the first reference current (Iref) 301 from the first current source (CS1) and the second reference current (Iref) 303 from the second current source (CS2) to scale all of the plurality of reference voltages into the predetermined voltage range, wherein the predetermined voltage range is the voltage range where the input voltage (Vin) 305 is positioned. An eighth step 508 comprises performing a second n−2 bit conversion, wherein the n−2 bits from the first n−2 bit conversion and the last 2-bits of the second n−2 bit conversion are utilized to form the total output for the n-bit conversion. A ninth step 509 comprises configuring a logic and error correction circuit 310 which corrects alignment errors between the two subsequent n−2 bit conversions and thus provides an appropriate digital output signal (adcout) 307. A tenth step 510 comprises achieving a resolution of n-bits utilizing $2^{n-2}$ resistors and $2^{n-2}$ comparators and providing a programmable resolution and a fast conversion speed.

Figure 6:
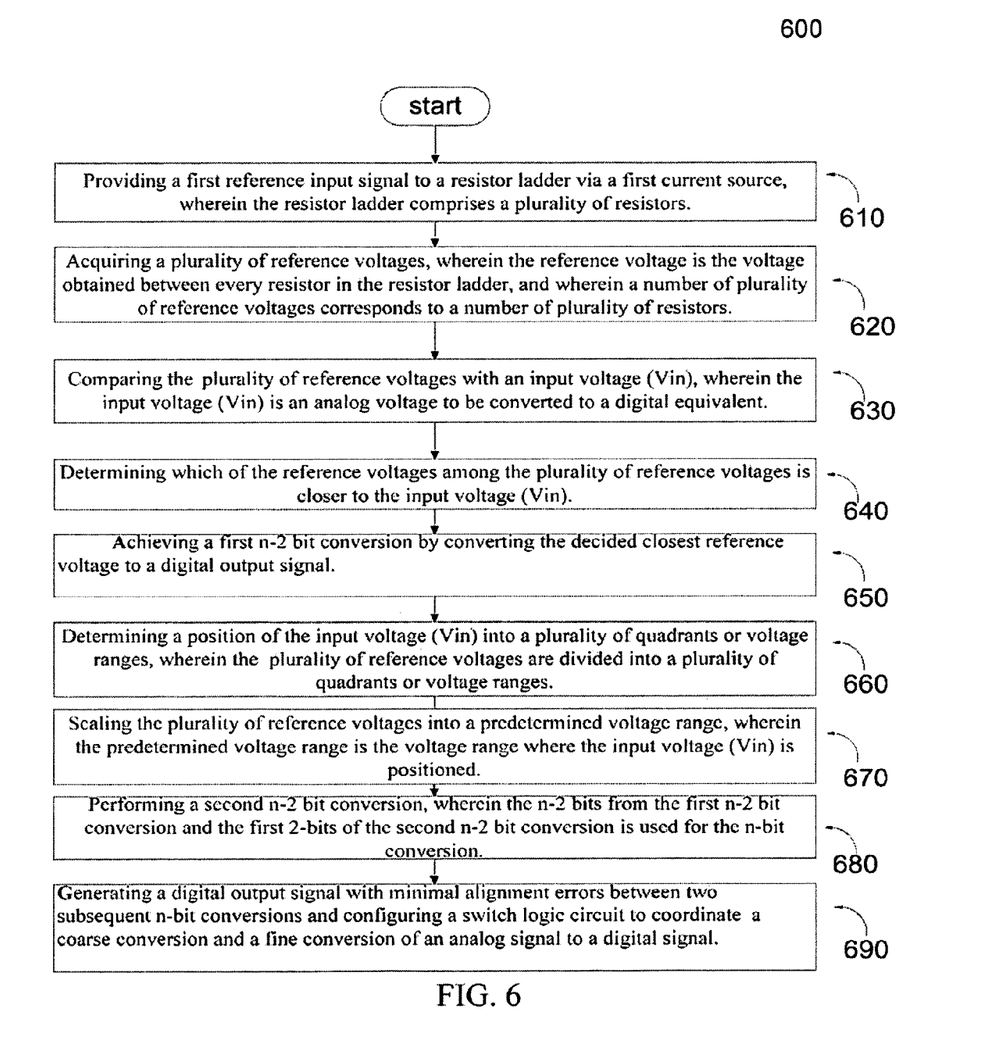
FIG. 6 illustrates a flow chart for converting an analog signal to a digital signal with improved programmable resolution and higher conversion speed.

FIG. 6 illustrates a flow chart 600 depicting a method for converting an analog signal to a digital signal with improved programmable resolution and high conversion speed in accordance with an exemplary and non limiting embodiment of the present invention. The method comprises a first step 610 of providing a first reference input signal to a resistor ladder via a first current source, wherein the resistor ladder comprises a plurality of resistors and a second step 620 of acquiring a plurality of reference voltages, wherein the reference voltage is the voltage obtained between every resistor in the resistor ladder, and wherein a number of plurality of reference voltages corresponds to a number of plurality of resistors. A third step 630 comprises comparing the plurality of reference voltages with an input voltage (Vin), wherein the input voltage (Vin) is an analog voltage to be converted to a digital equivalent, followed by a fourth step 640 of determining which of the reference voltages among the plurality of reference voltages is closer to the input voltage (Vin). A fifth step 650 comprises achieving a first n−2 bit conversion by converting the decided closest reference voltage to a digital output signal.

A sixth step 660 comprises determining a position of the input voltage ($V_{in}$) into a plurality of quadrants or voltage ranges, wherein the plurality of reference voltages are divided into a plurality of quadrants or voltage ranges. A seventh step 670 comprises scaling the plurality of reference voltages into a predetermined voltage range, wherein the predetermined voltage range is the voltage range where the input voltage (Vin) is positioned; and an eighth step 680 comprises performing a second n−2 bit conversion, wherein the n−2 bits from the first n−2 bit conversion and the first 2-bits of the second n−2 bit conversion are used for the n-bit conversion. A ninth step 690 comprises generating a digital output signal with minimal alignment errors between two subsequent n-bit conversions and configuring a switch logic circuit to coordinate a coarse conversion and a fine conversion of an analog signal to a digital signal.

The ADC in accordance with the exemplary embodiments of the present invention is programmable to trade off higher conversion speed for less accuracy or higher accuracy for slower conversion speed. This ADC also achieves $2^n$ bit accuracy using $2^{n-2}$ elements, thus minimizing any increase in area and power in accordance with a non-limiting example of the invention. To use fewer resistors during the higher accuracy conversion step, the present invention switches the reference level across the entire resistor ladder to give the result of increased resolution.

In an alternative exemplary embodiment of the present invention, each the first switch 332 and the second switch 334 can comprise a NMOS (N channel Metal Oxide Semiconductor) transistor or a PMOS (P channel Metal Oxide Semiconductor) transistor, although any suitable type of device or circuit can be used for such switches.

Exemplary embodiments of the present invention can be used in conjunction with any suitable type of integrated circuit, such as USBs, to achieve higher analog-to-digital conversion speed and to achieve a minimal area circuit.

Embodiments of the present invention are well suited to performing various other steps or variations of the steps recited herein, and in a sequence other than that depicted and/or described herein. In one embodiment, such a process can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Details of the improved analog-to-digital converter circuit with a programmable resolution and the methods of designing and manufacturing the same that are widely known and not relevant to the present discussion have been omitted from the present description for purposes of clarity and brevity.

It should be appreciated that reference throughout the present specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more exemplary embodiments of the present invention.

Similarly, it should be appreciated that in the foregoing discussion of exemplary embodiments of the invention, various features of the present invention are sometimes grouped together in a single embodiment, figure, or description thereof for the purpose of streamlining the disclosure to aid in the understanding of one or more of the various inventive aspects. Such a method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A programmable analog-to-digital circuit (ADC), comprising:
   a resistor ladder comprising a plurality of resistors coupled to inputs of a plurality of comparators,
   wherein the resistor ladder is further coupled to a switch logic circuit and a plurality of current sources, and
   wherein a switch logic is configured to control an operation of a plurality of switches to alter conversion resolution of the ADC, and
   an error correction circuit coupled to outputs of the plurality of comparators,
   wherein the ADC is configured to perform a first conversion step and a second conversion step, and
   wherein the ADC is configured to perform only the first conversion step when programmed for lower conversion accuracy and higher conversion speed.

2. The ADC of claim 1, wherein the ADC comprises a conversion resolution of n bits using $2^{n-2}$ resistors and $2^{n-2}$ comparators.

3. The ADC of claim 1, wherein the resistor ladder comprises a first connection and a second connection, and
   wherein the first connection comprises a first current source providing a first reference current coupled to the resistor ladder.

4. The ADC of claim 3, wherein the second connection of the resistor ladder is coupled to the switch logic,
   wherein the switch logic comprises a first switch, a second switch, and a resistor, and
   wherein the switch logic is coupled to a second current source.

5. The ADC of claim 1, wherein the error correction circuit is configured to generate a digital output signal with an n-bit resolution, and
   wherein the error correction circuit is configured to correct for alignment errors between two consecutive conversions.

6. The ADC of claim 1, wherein the first conversion step comprises a coarse measurement of an input signal to the ADC, and
   wherein the second conversion step comprises a fine measurement of the input signal.

7. The ADC of claim 6, wherein the plurality of resistors in the resistor ladder comprises a quantity of resistors needed for performing the coarse measurement.

8. An analog-to-digital converter (ADC) device, comprising:
   a resistor divider network;
   a plurality of switches coupled to a first end of the resistor divider network;
   a first current source coupled to a second end of the resistor divider network;
   a resistor coupled to one of the plurality of switches; and
   a second current source coupled to the resistor
   wherein the device is configured to perform a first conversion step and a second conversion step, and
   wherein the device is configured to perform only the first conversion step when programmed for lower conversion accuracy and higher conversion speed.

9. The device of claim 8, wherein the device is configured to provide a resolution of n-bits with $2^{n-2}$ resistors and $2^{n-2}$ comparators.

10. The device of claim 8, wherein the plurality of switches comprises a first switch and a second switch coupled to a grounded terminal and the second current source, respectively.

11. The device of claim 10, wherein each of the first switch and the second switch comprises a PMOS (P channel Metal Oxide Semiconductor) transistor.

12. The device of claim 10, wherein each of the first switch and the second switch comprises a NMOS (N channel Metal Oxide Semiconductor) transistor.

13. A method of converting an analog input signal to a digital output signal using an analog-to-digital converter (ADC) circuit comprising $2^{n-2}$ resistors and $2^{n-2}$ comparators and having a resolution of n-bits, the method comprising:
   a.) performing a coarse conversion measurement of the analog input signal to generate a coarsely-converted signal,
      wherein the digital output signal is generated in accordance with the coarsely-converted signal when the ADC is programmed for low conversion accuracy and high conversion speed; and
   b.) performing a fine conversion measurement of the coarsely-converted signal to generate a finely-converted signal,
      wherein the digital output signal is generated in accordance with the finely-converted signal when the ADC is programmed for high conversion accuracy and low conversion speed.

14. A method for converting an analog signal to a digital signal, comprising:
   providing a first reference input signal to a resistor ladder via a first current source, wherein the resistor ladder comprises $2^{n-2}$ resistors; and
   acquiring $2^{n-2}$ reference voltages, wherein the reference voltages are the voltages obtained between resistors in the resistor ladder;
   comparing the $2^{n-2}$ reference voltages with an input voltage (Vin), wherein the input voltage (Vin) is an analog voltage to be converted to a digital equivalent, using $2^{n-2}$ comparators;
   determining which of the reference voltages among the $2^{n-2}$ reference voltages is closest to the input voltage (Vin); and
   achieving a first (n−2) bit conversion by converting the closest reference voltage to a digital output signal.

15. The method of claim 14, the method comprising:

determining a position of the input voltage (Vin) into a plurality of quadrants or voltage ranges, wherein the reference voltages are divided into the plurality of quadrants or voltage ranges.

16. The method of claim 15, the method comprising:

scaling the reference voltages into a predetermined voltage range, wherein the predetermined voltage range is the voltage range where the input voltage (Vin) is positioned; and performing a second (n−2) bit conversion, wherein the (n−2) bits from the first (n−2) bit conversion and the last 2-bits of the second (n−2) bit conversion are used for the n-bit conversion.

17. The method of claim 16, the method comprising:

generating a digital output signal with minimal alignment errors between two subsequent n-bit conversions; and configuring a switch logic circuit to coordinate a coarse conversion and a fine conversion of an analog signal to a digital signal.

18. The method of claim 14, comprising:

for a first select input a first switch is closed, a second switch is open, a first current source is set to a first value to scale down a range of a resistor ladder;

for a second select input the first switch is open, the second switch is closed, bottom of the resistor ladder is raised from ground potential to a first potential;

for a third select input the first switch is open, the second switch is closed, a second current source is set to the first value, raising the first potential to a second potential; and for a fourth select input the second current source is set to a second value, raising the second potential to a third potential.

* * * * *